June 4, 1974 G. DUMAS 3,814,639

METHOD FOR THE SIMULTANEOUS DIFFUSION OF IMPURITIES IN SILICON AND SEMICONDUCTOR DEVICES RESULTING FROM IT

Filed Sept. 17, 1971

INVENTOR
GUY DUMAS
BY Sughrue, Rothwell, Mion, Zinn & Macpeak
ATTORNEYS 3,814,639

METHOD FOR THE SIMULTANEOUS DIFFUSION OF IMPURITIES IN SILICON AND SEMICONDUCTOR DEVICES RESULTING FROM IT

Guy Dumas, Paris, France, assignor to Societe Anonyme Silec-Semi-Conducteurs, Paris, France Filed Sept. 17, 1971, Ser. No. 181,500
Claims priority, application France, Dec. 7, 1970, 7043900
Int. Cl. H01l 7/44
U.S. Cl. 148—187 10 Claims

ABSTRACT OF THE DISCLOSURE

A method for the simultaneous diffusion of impurities into silicon comprising performing heat oxidation on sections of silicon in order to obtain a layer of silca $SiO_2$ on each section. The oxidized sections are subjected to a photoengraving operation in order to open "windows" necessary for the diffusion of a type *n* layer and then passed into a cleaning bath. The resulting sections are lined up in a quartz tube containing at least one source of at least two impurities, designed as a function of the desired structure with diffused layers *n* and *p*. This tube is charged and placed into a chamber which is heated to a suitable temperature in order to perform the simultaneous diffusion of layers *n* and *p*.

BACKGROUND OF THE INVENTION

Field of the invention

This invention relates to methods for the simultaneous diffusion of several impurities into silicon and more particularly, it concerns a method for the simultaneous diffusion of at least two impurities into sections of silicon through which, in a single diffusion operation, structures are obtained involving as many as four diffused layers. This method is used to make semiconductor devices with three or four diffused zones such as thyristors or triacs. This invention is also concerned with semiconductor devices which are obtained by cutting off sections of silicon which have been treated with this method.

Description of the prior art

In the prior art technique of making semiconductor devices, in order to obtain structures with four diffused layers for example, *npnp*, from sections of silicon of type *n*, a method requiring a sequence of the following operations is conventionally employed:

(1) After conventional cleaning of the silicon sections, the sections are subjected to heat treatment in order to obtain surface oxidation of silicon over a thickness on the order of 1$\mu$, this layer of oxide ($SiO_2$) or silica being necessary to prevent "piercing" by phosphorous, in the course of the preliminary deposit of the latter, constituting one of the subsequent operations of this method;

(2) These oxidized sections then, in a sealed tube, undergo gallium diffusion (type *p* contamination) at a temperature between 1,200 and 1,250° C., the silica layer here allowing the gallium atoms to pass without any weakening or delay and protecting the surface of the silicon against local attacks from gallium;

(3) The sections which at this point involve two diffused zones of gallium, are subjected to photoengraving treatment, using masks which will determine the placement of the "windows" in the oxide layer, where the phosphorous will be diffused (type *n* contamination);

(4) After conventional cleaning of photoengraved sections, especially to remove the resin, the preliminary deposit of *n*+ in the windows is effected, taking into account the characteristics of the *p* diffusion already accomplished under step (2), and using, for example, a liquid source of $POCl_3$; this preliminary deposit operation is accomplished at a temperature between 1,160 and 1,200° C. and takes place over a period of time between 30 minutes and 1 hour;

(5) After this preliminary deposit, the phosphorous glass, which still covers the silica, is attacked by a specific cleaning process so as to eliminate it and to prevent the piercing of the oxide mask during the following phosphorous diffusion operation;

(6) The phosphorous diffusion is then performed in order to obtain a diffused layer *n*+, said diffusion being performed at a temperature in the range of 1,250° C. and over a period of time between 2 and 5 hours, depending on the type of device desired;

(7) The silicon sections, which then have three or four diffused layers, are cleaned conventionally in order to deoxidize them;

(8) Finally, since the preceding operations, on these sections, reduced the surface gallium concentration, a light *p*+ enrichment is performed. This enrichment of the gallium concentration is accomplished either by means of a new gallium diffusion on a depth of about 10 microns or by means of a boron diffusion after "pasting" the sections with boron oxide ($B_2O_3$). This enrichment of *p*+ is, however, so conducted that it will not invert the diffused *n* zones. The time is relatively short and dependent upon the temperature and the devices which are desired.

At this stage, the structure obtained involves three or four diffused zones and the sections can undergo finishing operations, such as, for example nickel plating for the formation of contact taps, cutting, etc., in order to obtain the semiconductor devices considered here.

In view of the large number of treatment operations which these sections of silicon must undergo before they can be used, among others, five diffusion operations all of which must be perfectly controlled, this present method involves numerous inconveniences, among which are the slow speed of producing the devices, the numerous manipulations which they must undergo, and because of that, the high cost. These inconveniences to some extent reduce the demand for such devices, especially in industry.

SUMMARY OF THE INVENTION

Consequently, the method of the present invention tends to eliminate the inconveniences presented by the diffusion methods of the prior art technique and, among others, considerably reduce the number of operations required to obtain semiconductor devices with four diffused zones.

This new method, constituting one of the main objects of the invention, is based on the use, in the course of a single diffusion operation, of doping sources made up of at least two impurities to obtain *n* and *p* layers with a given concentration and depth.

More specifically, this method is characterized by the fact that it consists of the following: in performing first of all, on sections of type *n* silicon, a heat oxidation to obtain a silica layer whose thickness is not critical because in the course of this method, it will not be subjected to the formation of a glass, as is the case in the prior art diffusion method, and because of this several hundred angstroms may suffice. The oxidized sections of the silicon are subjected to a photoengraving operation to open the "windows" necessary for the diffusion of the *n* layers as is the case in the third operation in the prior art method. The sections are then passed through a cleaning bath, such as a bath of hydrofluoric acid, diluted so as to deoxidize the windows perfectly. Four sections are then lined up in a quartz tube, as well as at least one source of at least two impurities (*n* and *p*), designed as a function of the desired structure with diffused layers. The quartz tube is then sealed under argon. The tube is then placed in a chamber which is brought to a suitable temperature in order to accomplish the simultaneous diffusion of the *n* and *p* layers.

This diffusion method as opposed to the prior art method requires only two heat treatments of the silicon and only the diffusion operation requires careful control. On this basis, persons experienced in diffusion techniques will immediately realize that the main difficulty in simultaneous diffusion of at least two impurities, included in the operations of this new method, resides in the impossibility of independently regulating the penetration depths and the concentrations of the two impurities. The method of this invention uses sources which make it possible to obtain the diffused zones corresponding to the structure of each of the desired semiconductor devices.

Consequently, it is another object of this invention to provide for a method so as to obtain such sources.

According to the invention, such a method is characterized by the fact that it comprises the following: determining the impurities couple (*n* and *p*) likely to lead to the desired structure, then deciding as to the form in which the impurities will be introduced and, finally, spelling out the possible range of diffusion temperatures.

The sources used here are of two types: (1) a mixture of simple or compound bodies of the two elements; (2) silicon powder, doped by the two impurities with a certain concentration.

In order better to understand this method for obtaining sources of impurities, and in order efficiently to accomplish the implementation of the simultaneous impurities diffusion method, in the course of the production of semiconductors with four layers *npnp* diffused in a silicon monocrystal, the following studies were conducted.

Since, in fact, the purpose of this invention is to reduce to a minimum the number of impurities diffusion operations, required by the methods involved in the prior art so as to obtain semiconductors with four diffused layers, as basis for the test, sections of silicon of type *n* were used in the stage in which, after the photoengraving operation, had open windows in the silica layer.

First of all, separate tests of diffusing just one impurity were conducted on these sections in order to permit the exploration of the various concentrations that could be obtained; these impurities were selected, on the one hand, from among those giving a contamination of type *p* (gallium, aluminum, boron) and, on the other hand, from among those giving a doping of type *n* (phosphorous, arsenic, antimony). These tests showed that only gallium very easily went through the silica layer, whereas aluminum and boron, as well as arsenic and phosphorous, were slowed down by the layer, the latter here being particularly considerably slowed down. Furthermore, the antimony presented a diffusion coefficient which was too weak to be used. On the basis of these results, it was possible to deduce that the only impurity present and capable of being used so as to furnish diffused zones of type *p* was gallium. Arsenic or phosphorous could be suitable for the doping of type *n*. In other words, the only couples of impurities that could be used in these sources were arsenic-gallium and phosphorous-gallium.

Second, tests were conducted on the simultaneous diffusion of two impurities according to the following two techniques:

(1) Doping source made up of the elements or a compound;

(2) Doping source made up of diffused silicon powder.

In the first type of doping source, it suffices to find a desired compromise between structure and diffusion temperature. In this case, the surface concentrations will be the maximum concentrations corresponding to the diffusion temperature, the latter however being limited by the partial pressure of the sources. For example, in the case of a diffusion with a source of gallium arsenide, the maximum temperature is around 1,240° C. because beyond that the pressure of arsenic increases very rapidly. This pressure is only 0.1 atm. abs. at 1,200° C. but increases to 1 atm. abs. around 1,280° C.

The second type of doping source requires a more elaborate technology because, in the first phase, it is advisable to prepare the silicon powder with the desired concentrations in terms of impurities. These concentrations can be obtained in several ways:

(a) By mixing two powders, each powder containing one impurity;

(b) By mixing two powders, one containing two impurities and the other one containing zero or one;

(c) By a single powder directly possessing the desired concentrations.

The impurities are introduced in the silicon by either simultaneous or successive diffusions. A doped gallium and phosphorous powder is obtained in the following fashion:

A high-purity polycrystalline silicon ingot is crushed and then screened so as to isolate the fraction whose grain size is near $40\mu$. This powder is placed in a quartz boat with a little piece of alloyed gallium on a section of silicon at one end and, at the other end, a little piece of red phosphorous. The entire assembly is then introduced into the quartz tube which is sealed under argon and slowly brought up to a temperature of 1,300° C. in about 72 hours. This operation produces a doped gallium powder with $1\text{–}3\cdot10^{19}$ atoms/cm.$^3$ and, in terms of phosphorous, at $10^{21}$ atoms/cm.$^3$. To get a source of $2\cdot10^{19}$ at./cm.$^3$ in terms of Ga and $5\cdot10^{20}$ in terms of phosphorous, the above powder is mixed with an equal quantity of diffused silicon powder with only gallium with a concentration of $2\cdot10^{19}$ at./cm.$^3$. The use of the source thus formed produces on the surface of the silicon sections, some $C_S$ slightly less than those of the source.

This must be kept in mind in preparing the source.

Furthermore, these tests have shown that, in the case of the simultaneous diffusion accomplished by means of the powders in the seal quartz tube:

(1) It is possible to select the impurities concentrations independently of the diffusion temperature;

(2) The concentrations obtained will be independent of the diffusion temperature if they are less than the limit concentrations at this temperature and, because of this, it is then possible to diffuse low concentrations at high temperatures;

(3) This method of diffusion by means of doped silicon powder also makes it possible not to be limited in terms of diffusion temperature, as in the case of the use of a compound or of the elements arsenic and gallium or phosphorous and gallium as doping source;

(4) The silicon powder doped with arsenic and gallium may be used up to about 1,300° C. in a sealed tube, whereas gallium arsenide cannot be used beyond 1,240° C. because of the pressure from the arsenic. It may perhaps be advantageous to work in two phases, that is to say: to dope the silicon powder by means of gallium arsenide at a temperature less than 1,240° C. and then to use the doped powder at a temperature higher than 1,240° C. The surface concentrations will be unchanged but the profile could be modified by using a higher temperature in diffusion.

These simultaneous diffusion tests showed that, for purposes of efficiently implementing the invention, that is to say, to get good reproducibility of this diffusion method, it was necessary to observe a certain number of precautions, among which are the following:

(a) Perfect deoxidation of the "windows" made in the silica must be accomplished prior to the placement of the oxidized silicon sections in the quartz tube and to do so it is presently preferable to pass these sections into a diluted hydrofluoric acid bath;

(b) The sources of impurities must also be completely devoid of any oxidation.

(c) Prior to the final sealing of the quartz tube, the latter and its content must be heated in a vacuum and, while sealing, it is necessary to prevent any introduction of water vapor;

(d) Diffusion must preferably be accomplished under argon whose pressure must be so calculated as to obtain a total pressure essentially equal to or near the atmospheric pressure at the diffusion temperature, and this must be done in order to prevent the crushing or bursting of the tube in the course of diffusion.

This simultaneous diffusion method may be implemented by using open quartz tubes, although, to do this, it is necessary to bring about a very large amount of scavenging and, it seems, the means employed to obtain this are more expensive, in spite of the possible recovery of the quartz tubes, than the operations involved in sealing them.

Finally, the advantages of this simultaneous diffusion method of at least two impurities in sections of silicon will be even more apparent with reference to the attached drawing where:

BRIEF DESCRIPTION OF THE DRAWINGS

FIG. 1*a* shows a small plate of silicon of type *n*, oxidized by heat oxidation and then coated with silica ($SiO_2$) on its two faces.

FIG. 1*b* shows the small plate in FIG. 1*a* having undergone gallium diffusion in a sealed tube and involves two diffused zones of type *p* under the silica layers and on either side of a zone *n*, zone *n* then remaining the initial small plate of silicon.

FIG. 1*c* shows the small plate in FIG. 1*b*, wherein windows F1, F2 have been made by photoengraving in the silica layers in order to form openings for the admission of the preliminary deposit in $n+$ by liquid source of $POCl_3$, for example.

FIG. 1*d* shows the plate in FIG. 1*c*, where phosphorous glass, which covered the silica has been attacked so as to prevent the perforation of the silica mask during the diffusion of the $n+$ layers.

FIG. 1*e* shows the plate in FIG. 1*d*, where it has undergone the diffusion operation involving the $n+$ layers.

It should be noted that, after the operation diffusion of these $n+$ layers, it is often necessary once again to perform a gallium ($p+$) diffusion on a depth of about 10 microns since the preceding operations reduced the surface gallium concentration.

Figures 1A, 1B, 1C, 1D, 1E, 2A, 2B, 2C:
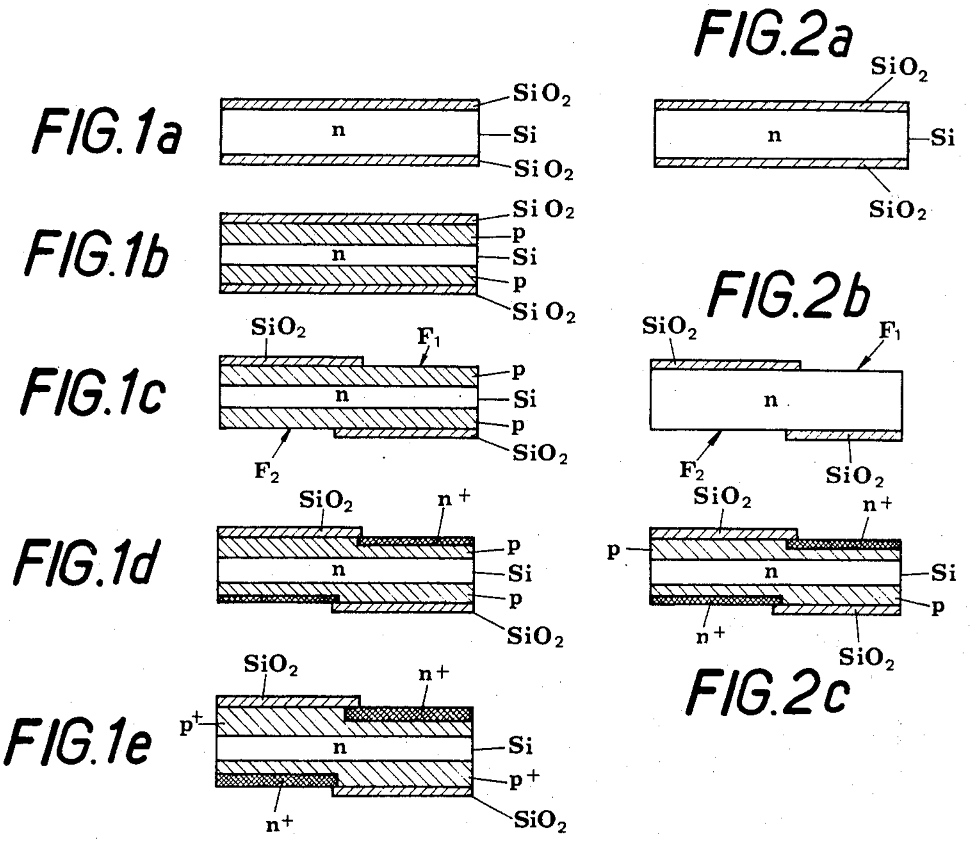
FIGS. 1*a* to 1*e* show the various stages in a conventional method for the diffusion of two impurities in sections of silicon of type *n* so as to obtain semiconductor devices with four diffused layers.
FIGS. 2*a* to 2*c* show the stages of the method of the present invention for the simultaneous diffusion of at least two impurities in sections of silicon of the same type, so as to obtain similar semiconductor devices with four diffused zones, such as thyristors or triacs.

The stages of the new method for the simultaneous diffusion of two impurities are shown in FIGS. 2*a*–2*c*:

FIG. 2*a* shows the thin plate of silicon covered on its two sides with a layer of silica ($SiO_2$) as in FIG. 1*a*;

FIG. 2*b*, as in FIG. 1*c*, shows the thin plate in FIG. 2*a*, when "windows" F1 and F2 were opened in the silica layers by photoengraving; and FIG. 2*c* shows the structure with four diffused zones *npnp*, obtained after the operation of simultaneous diffusion of two impurities of corresponding types.

Figure 3:
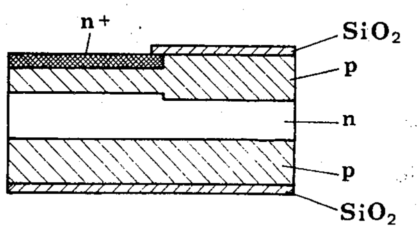

It should be noted that FIG. 3 shows the structure obtained after the implementation of the simultaneous diffusion method when we have a phenomenon where one of the impurities is slowed down by the other one, this slowdown being in fact a function of the diffusion temperature and the concentrations of the two doping agents.

Furthermore, the preparation of doped silicon powder, containing the impurities in the desired concentration, can be accomplished in several ways according to this invention:

(a) By a silicon ingot containing the impurities, although this operation must in certain cases be limited by the value of the separation coefficient. In the case of gallium, for example, the limit is $5\cdot10^{17}$ atoms per cm.$^3$ and, the concentrations vary along the ingot, which causes difficulties in proportion to the concentrations;

(b) By means of diffusions of impurities in the silicon powder, these diffusions here being capable of being either simultaneous or successive, the concentration employed here being the one obtained on the surface; it should be noted that, in this case, the concentration control is easily accomplished with the help of controls placed in the powder;

(c) By mixing powders, each powder being capable of containing one or several impurities;

(d) By combining these methods, that is to say, for example, by diffusion of other impurities into a powder from a doped silicon ingot.

The quantity of powder necessary in order to dope a section of silicon with a diameter of 32 mm. is on the order of 1 gram, this quantity depending partly on the average grain size selected, which is preferably near 50 microns.

The following are examples for implementing this method for the simultaneous diffusion of at least two impurities in sections of silicon having led to the creation of semiconductor structures with four diffused *npnp* zones.

EXAMPLE 1

Making a triac by simultaneous diffusion on the basis of gallium arsenide. The diffusion lasts 36 hours at 1,180° C. and the pressure of argon introduced at the beginning is 0.2 atm. abs. The source is made up of 1 gram of gallium arsenide for 100 sections with a diameter of 33 mm. placed in a silicon boat. The silicon sections are placed in a quartz boat. The quartz tube is heated in a vacuum, as is the source and the sections, prior to sealing.

The concentrations and the diffusion depth obtained are as follows:

$X_{J_N}=13\mu$
$C_{S_N}=5\cdot10^{20}$ at./cm.$^3$
$X_{J_P}=33\mu$
$C_{S_P}=1$ to $2\cdot10^{19}$ at./cm.$^3$

EXAMPLE 2

Making a thyristor by simultaneous diffusion from diffused arsenic and gallium powder. Powder preparation: 65 grams of pure silicon powder, 3.7 grams of gallium arsenide on a silicon boat. Diffusion 62 hours at 1,200° C. in sealed tube.

Characteristics of powder:

$C_{S_P}\simeq8\cdot10^{18}$ at./cm.$^3$
$C_{S_N}\simeq5\cdot10^{20}$ at./cm.$^3$ Doping of silicon sections with 1 gram of the above powder for a section with a diameter of 33 mm. Diffusion in sealed tube at 1,250° C. for a period of 7½ hours, leading to the following characteristics:

$X_{J_N}=8\mu$
$C_{S_N}=2\cdot10^{20}$ at./cm.$^3$
$X_{J_P}=33\mu$
$C_{S_P}=5\cdot10^{18}$ at./cm.$^3$ This invention is not limited to the implementation examples just described; it is, on the contrary, susceptible to variations and modifications which will occur to the expert in the field.

What is claimed is:

1. A method for the simultaneous diffusion of several impurties into semiconductor substrates for producing structures having three of four *n* and *p* type layers consisting of the steps of:

(a) heat oxidizing said substrates to obtain an oxidized layer on said substrates;

(b) photo-engraving portions of said oxidized layer to form windows;

(c) passing said substrates through a cleaning bath of diluted hydrofluoric acid and wherein said windows are perfectly deoxidized;

(d) placing at least one of said substrates and at least one source of at least two impurities which are devoid of any oxidation in a quartz tube wherein said source is positioned relative to said substrates to form said structures;

(e) heating said quartz tube and its contents in a vacuum to prevent any introduction of water vapor into said tube and then finally introducing argon in the amount to provide a pressure substantially equal to atmospheric pressure at the diffusion temperature and sealing said tube; and (f) uniformly heating said tube to a temperature to cause the simultaneous diffusion of said impurities thereby forming said *n* and *p* type layers.

2. The method of claim 1 wherein said semiconductor substrate is silicon and said oxidized layer is silica.

3. The method of claim 1 wherein said substrate is heat oxidized for a period of time such that the thickness of said oxidized layer is several thousand angstroms.

4. The method of claim 1 wherein a plurality of said substrates are lined up in said quartz tube in such a manner as to leave space between each substrate and space along the interior of the tube to facilitate the maximum circulation of doping vapors during the simultaneous diffusion operation.

5. The method of claim 1 wherein the temperature to which said tube is heated to cause the simultaneous diffusion does not exceed 1,300° C.

6. The method of claim 1 wherein said at least two impurities are a mixture.

7. The method of claim 6 wherein said mixture is a mixture of arsenic and gallium.

8. The method of claim 1 wherein said at least two impurities are a compound.

9. The method of claim 8 wherein said compound is gallium arsenide.

10. The method of claim 8 wherein said compound is gallium phosphide.

References Cited

UNITED STATES PATENTS

| | | | |
|---|---|---|---|
| 2,802,760 | 8/1957 | Derick et al. | 148—189 |
| 2,861,018 | 11/1958 | Fuller et al. | 148—189 |
| 3,025,589 | 3/1962 | Hoerni | 29—578 |
| 3,167,461 | 1/1965 | Compton | 148—189 UX |
| 3,271,210 | 9/1966 | Pritchard | 148—189 X |
| 3,377,216 | 4/1968 | Raithel | 148—189 |
| 3,484,313 | 12/1969 | Tauchi et al. | 148—187 |
| 3,615,945 | 10/1971 | Yokozawa | 148—190 |
| 3,658,606 | 4/1972 | Lyons et al. | 148—189 X |

L. DEWAYNE RUTLEDGE, Primary Examiner

J. M. DAVIS, Assistant Examiner

U.S. Cl. X.R.

29—577; 317—235